United States Patent
Akiyama et al.

(10) Patent No.: US 8,823,360 B2
(45) Date of Patent: Sep. 2, 2014

(54) SEMICONDUCTOR DEVICE

(75) Inventors: Hajime Akiyama, Tokyo (JP); Akira Okada, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 139 days.

(21) Appl. No.: 13/213,778

(22) Filed: Aug. 19, 2011

(65) Prior Publication Data

US 2012/0161751 A1 Jun. 28, 2012

(30) Foreign Application Priority Data

Dec. 22, 2010 (JP) ................................ 2010-286342

(51) Int. Cl.
*G01R 15/18* (2006.01)
(52) U.S. Cl.
USPC .................. 324/117 R; 324/117 H; 324/251; 324/207.21; 324/248; 324/249; 338/32 R; 338/32 H; 257/421; 257/422; 257/427
(58) Field of Classification Search
USPC ..................... 324/117 R, 117 H, 179, 207.21, 324/248–249, 251, 252, 389; 338/32 R, 338/32 H; 257/421, 422, 427, E29.323
See application file for complete search history.

(56) References Cited

U.S. PATENT DOCUMENTS

| | | | | |
|---|---|---|---|---|
| 4,700,211 A | * | 10/1987 | Popovic et al. | 257/423 |
| 4,937,521 A | | 6/1990 | Yoshino et al. | |
| 5,023,684 A | * | 6/1991 | Tsunoda | 257/423 |
| 5,049,809 A | * | 9/1991 | Wakatsuki et al. | 324/117 R |
| 5,990,533 A | * | 11/1999 | Hasegawa | 257/421 |
| 6,819,095 B1 | * | 11/2004 | Dubhashi et al. | 324/117 H |
| 7,463,016 B2 | * | 12/2008 | Shoji | 324/117 R |
| 7,518,354 B2 | * | 4/2009 | Stauth et al. | 324/117 R |
| 2004/0155644 A1 | | 8/2004 | Stauth et al. | |
| 2006/0071655 A1 | * | 4/2006 | Shoji | 324/117 H |
| 2006/0181263 A1 | * | 8/2006 | Doogue et al. | 324/117 H |
| 2009/0295368 A1 | * | 12/2009 | Doogue et al. | 324/117 H |
| 2010/0237450 A1 | * | 9/2010 | Doogue et al. | 257/427 |

FOREIGN PATENT DOCUMENTS

| | | |
|---|---|---|
| CN | 1924603 A | 3/2007 |
| JP | 03-090872 A | 4/1991 |
| JP | 09-043327 A | 2/1997 |
| JP | 9-127161 | 5/1997 |
| JP | 9-162391 | 6/1997 |
| JP | 2001-165962 | 6/2001 |

(Continued)

OTHER PUBLICATIONS

Office Action issued Nov. 19, 2013 in Chinese Patent Application No. 201110432580.8 (with partial English translation).
Taiwanese Office Action issued Nov. 19, 2013, in Taiwan patent application No. 100129907 (with partial English translation).
Office Action issued Feb. 25, 2014 in Japanese Patent Application No. 2010-286342 (with partial English language translation).

(Continued)

*Primary Examiner* — Tung X Nguyen
*Assistant Examiner* — Thang Le
(74) *Attorney, Agent, or Firm* — Oblon, Spivak, McClelland, Maier & Neustadt, L.L.P.

(57) ABSTRACT

A semiconductor device comprises: a semiconductor element including an electrode; a leading line electrically connected to the electrode, passing above the electrode, and led to a side thereof; and a current sensor sensing current flowing through the leading line. The current sensor includes a magneto-resistance element placed above the electrode and below the leading line. A resistance value of the magneto-resistance element varies linearly according to magnetic field generated by the current.

4 Claims, 7 Drawing Sheets

(56) References Cited

FOREIGN PATENT DOCUMENTS

| JP | 2001-194391 A | 7/2001 |
| JP | 2008-516255 | 5/2008 |
| JP | 2009-111294 | 5/2009 |
| WO | WO 2005/081007 A1 | 9/2005 |
| WO | WO 2008/146809 A1 | 12/2008 |

OTHER PUBLICATIONS

Chinese Office Action issued Apr. 24, 2014 in corresponding Chinese Patent Application No. 201110432580.8 (with English Translation), (14 pages).

Taiwanese Patent Office Action issued May 26, 2014, in Taiwan Patent Application No. 100129907 (w/ partial English translation), 10 pages.

* cited by examiner

SEMICONDUCTOR DEVICE

BACKGROUND OF THE INVENTION

1. Field of the Invention

The present invention relates to a semiconductor device equipped with a current sensor. More specifically, the present invention relates to a semiconductor device that can improve current sensing accuracy without widening the chip area.

2. Background Art

In order to sense current flowing through a semiconductor element, a current sensor is used. As the current sensor, a semiconductor device wherein a current sensing region is formed in the same chip as the semiconductor element has been proposed (for example, refer to Japanese Patent Application Laid-Open No. 9-162391). As the current sensor, a semiconductor device using an AMR (anisotropic magneto resistance) element is place of the current sensing region has also been proposed (for example, refer to Japanese Patent Application Laid-Open No. 9-127161).

SUMMARY OF THE INVENTION

The semiconductor device according to Japanese Patent Application Laid-Open No. 9-162391 has a problem wherein the mutual interference of carriers occur in the border region between a main cell region and a current sensing region depending on the location where the current sensing region is formed in the chip, and the ratio of the currents flowing through both of the regions is varied. For this reason, there has been a problem wherein the current sensing accuracy of the current sensor is low.

In the current sensor using the AMR element according to Japanese Patent Application Laid-Open No. 9-127161, such a problem does not occur. However, the characteristics of the resistance value of the AMR element against the magnetic field is an inverted V-shape as shown in FIG. 3 in Japanese Patent Application Laid-Open No. 9-127161. Therefore, in order to make the inverted V-shape linear when the AMR element is applied to the current sensor, addition of a constant-current circuit shown in FIG. 1 in Japanese Patent Application Laid-Open No. 9-127161 is required. For this reason, there has been a problem wherein the chip area is enlarged.

In view of the above-described problems, an object of the present invention is to provide a semiconductor device that can improve current sensing accuracy without widening the chip area.

According to the present invention, a semiconductor device comprises: a semiconductor element including an electrode; a leading line electrically connected to the electrode, passing above the electrode, and led to a side thereof; and a current sensor sensing current flowing through the leading line, wherein the current sensor includes a magneto-resistance element placed above the electrode and below the leading line, and a resistance value of the magneto-resistance element varies linearly according to magnetic field generated by the current.

The present invention makes it possible to improve current sensing accuracy without widening the chip area.

Other and further objects, features and advantages of the invention will appear more fully from the following description.

DETAILED DESCRIPTION OF THE PREFERRED EMBODIMENTS

A semiconductor device according to the embodiments of the present invention will be described with reference to the drawings. The same components will be denoted by the same symbols, and the repeated description thereof may be omitted.

First Embodiment

Figure 1:
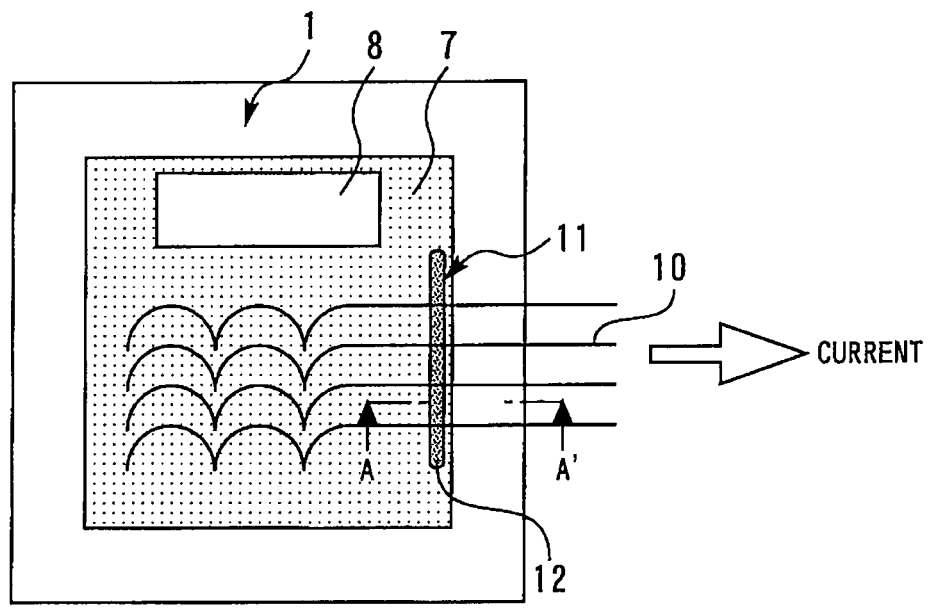
FIG. 1 is a plan view showing a semiconductor device according to the first embodiment of the present invention.
Figure 2:
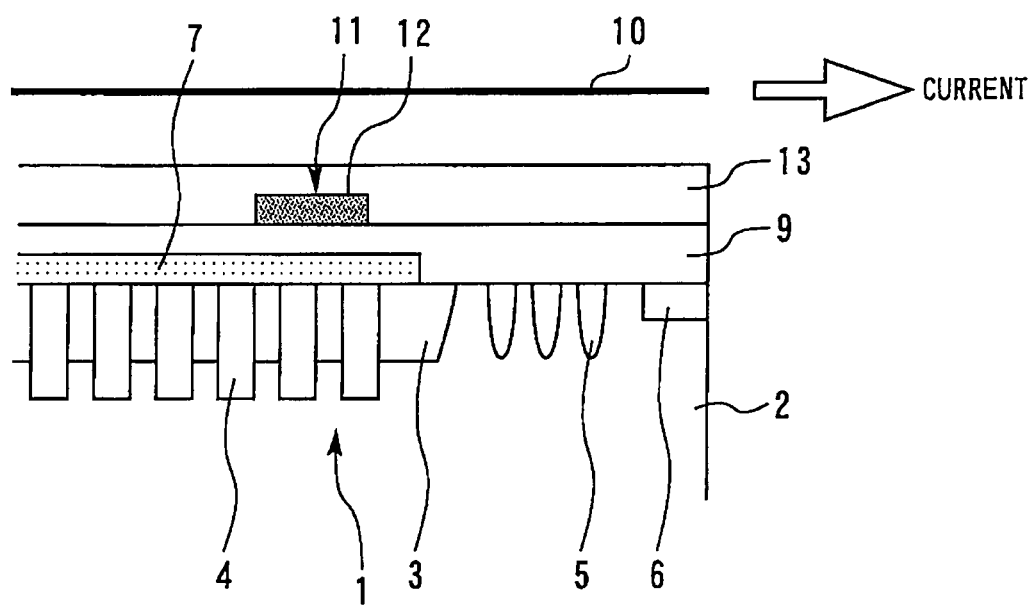
FIG. 2 is a sectional view taken along the line A-A' in FIG. 1.

FIG. 1 is a plan view showing a semiconductor device according to the first embodiment of the present invention. FIG. 2 is a sectional view taken along the line A-A' in FIG. 1. A semiconductor element 1 is an insulated gate bipolar transistor (IGBT) applied to a power converter, such as an inverter. A p-type well base region 3 is formed in the vicinity of the surface of a semiconductor substrate 2. Trench gates 4 are formed so as to penetrate a p-type well base region 3. Guard ring P-type well regions 5 and an N+-type channel stopper 6 are formed around the p-type well base region 3. An emitter electrode 7 and a gate electrode 8 are formed on the surface side of the chip. The emitter electrode 7 is coated with an insulating isolation film 9.

Leading lines 10 are electrically connected to the emitter electrode 7. The leading lines 10 pass above the emitter electrode 7 and are led to the side. Generally, the leading lines 10 are wires for wire bonding; however, they are not limited thereto and can be front metals. The current sensor 11 has a magneto-resistance element 12, and senses the current flowing to the leading lines 10. The magneto-resistance element 12 is placed above the emitter electrode 7 and below the leading lines 10 via the insulating isolation film 9. The magneto-resistance element 12 is coated with the insulating isolation film 13.

The magneto-resistance element 12 is a magneto-resistance element of a linear output type, and the resistance value thereof varies linearly according to magnetic field generated by the current. Specifically, the magneto-resistance element 12 is any one of a spin-valve TMR (tunnel magneto resistance) element, a spin-valve GMR (giant magneto resistance) element, and an AMR (anisotropic magneto resistance) element with barber-pole electrodes.

Next, the operation of the semiconductor device according to the present embodiment will be described. The semiconductor element 1, which is a switching device, controls the current flowing between the emitter and the collector with the gate potential. When the semiconductor element 1 is an Nch-IGBT, the current flows from the emitter electrode 7 through the leading lines 10 to the exterior of the chip. Depending on the intensity of the magnetic field generated by the current, the resistance value of the magneto-resistance element 12 placed immediately below the leading lines 10 is linearly varied. Therefore, by measuring the current flowing in the magneto-resistance element 12 or the voltage applied thereto and sensing the intensity of the magnetic field, the current flowing in the leading line 10 can be sensed.

Figure 3:
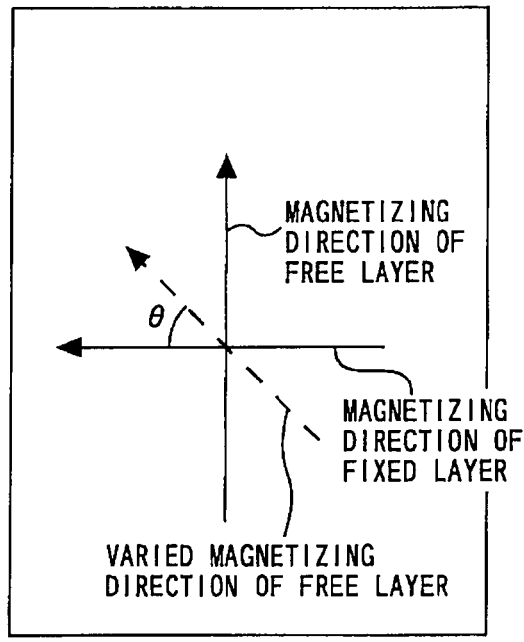
FIG. 3 is a graph showing the magnetizing direction of the free layer and the fixed layer of the magneto-resistance element of the spin valve type.

Here, the sensing operation when a spin-valve magneto-resistance element is used as the magneto-resistance element 12 will be specifically described referring a diagram. FIG. 3 is a graph showing the magnetizing direction of the free layer and the fixed layer of the magneto-resistance element of the spin valve type. The angle between the magnetizing direction of the free layer and the magnetizing direction of the fixed layer is 90°. When an external magnetic field is applied in the orientation along the magnetizing direction of this fixed layer, the magnetizing direction of the free layer is varied. According to the varied angle θ between the magnetizing direction of the free layer and the magnetizing direction of the fixed layer, the resistance value of the magneto-resistance element is linearly varied. Specifically, the resistance value of the magneto-resistance element is inversely proportional to $\cos \theta$.

When the free layer is a soft magnetic film having uniaxial unisotropy, $\cos \theta$ is $|Hk|/H$. Therefore, when an external magnetic field higher than $|Hk|$ is applied, the varied magnetizing direction of the free layer is fixed in parallel or antiparallel to the magnetizing direction of the fixed layer, and the resistance of the element is not varied any more. Specifically, Hk is the saturated magnetic field of the free layer.

Figure 4:
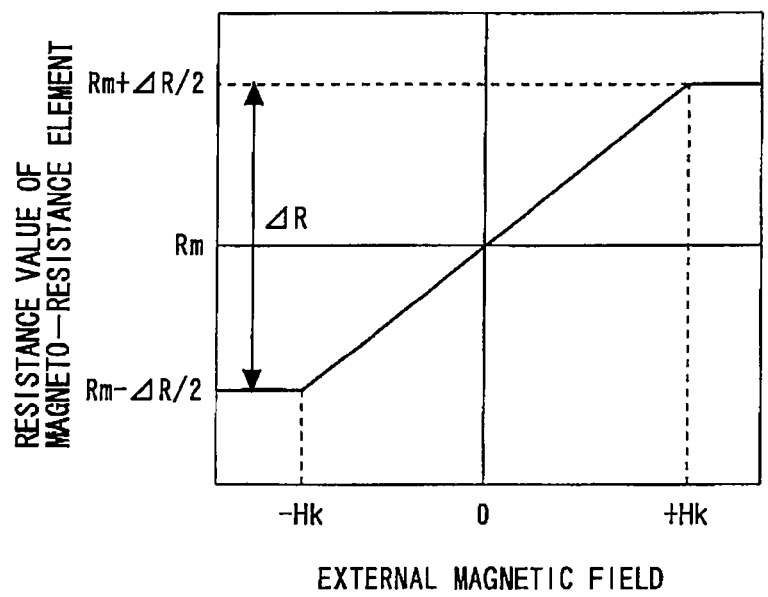
FIG. 4 is a graph showing the resistance value of a magneto-resistance element against an external magnetic field.

FIG. 4 is a graph showing the resistance value of a magneto-resistance element against an external magnetic field. When the angle between the magnetizing direction of the free layer and the magnetizing direction of the fixed layer is 90°, the resistance value R of the magneto-resistance element is $Rm+\Delta R/2 \times H/|Hk|$ (where $-|Hk| \leq H \leq |Hk|$), where Rm is the resistance value of the magneto-resistance element in a non-magnetic field, and is the intermediate value of the maximum resistance value and the minimum resistance value which the magneto-resistance element may have. ΔR is the rate of change of the resistance value of the magneto-resistance element.

As described above, since the resistance value R of the magneto-resistance element is proportional to the external magnetic field, if the current flowing in the magneto-resistance element or the applied voltage is obtained, the amplitude of the external magnetic field can be sensed. The sensed external magnetic field is the orientation component of the magnetizing direction of the fixed layer. The detectable range of the directional component, that is, the movable range of the current sensor is $-|Hk| \leq H \leq |Hk|$.

The phenomenon wherein the resistance value of the magneto-resistance element is varied depending on the intensity of the external magnetic field is referred to as the magneto-resistance effect. The phenomenon wherein the resistivity of a substance having spontaneous magnetization, such as ferromagnetic materials, is varied depending on the magnetizing state obtained by application of magnetic field to the substance is referred to as the abnormal magneto-resistance effect. Among these, the phenomenon wherein the resistance of a ferromagnetic thin film, such as a Permalloy film, is varied depending on the direction of spontaneous magnetization is specifically referred to as the anisotropic magneto-resistance effect (AMR effect) or the orientation effect. The phenomenon wherein the resistance of an F/N/F metallic lattice or a multilayer thin film formed by repeating the lamination thereof is decreased by application of magnetic field so as to make magnetization parallel is referred to as the giant magneto-resistance effect (GMR effect). This effect is characterized in that the variation rate is large in comparison with AMR. The phenomenon wherein the tunnel current is varied depending on the relative angles of the magnetization of two ferromagnetic materials in the bonding of the insulating material sandwiched by the ferromagnetic materials is referred to as tunnel magneto-resistance effect (TMR effect). In both the GMR effect and the TMR effect, the variation of resistance depending on the relative angle of the magnetization of ferromagnetic layer is observed. In the GMR effect, the dependency is observed when the parallel current is flowed in the laminate surface, and the perpendicular current is flowed in the laminate surface. In the TMR effect, the dependency is observed only when the perpendicular current is flowed in the laminate surface.

As described above, in the present embodiment, a magneto-resistance element of the linear output type is used. Therefore, the current sensing accuracy can be elevated in comparison with the case wherein a current sensing region is used as the current sensor. Furthermore, the resistance value of the magneto-resistance element of the linear output type is linearly varied. Therefore, since the addition of a circuit for linearizing the characteristics of the magneto-resistance element is not required, the chip area is not widened.

Figure 5:
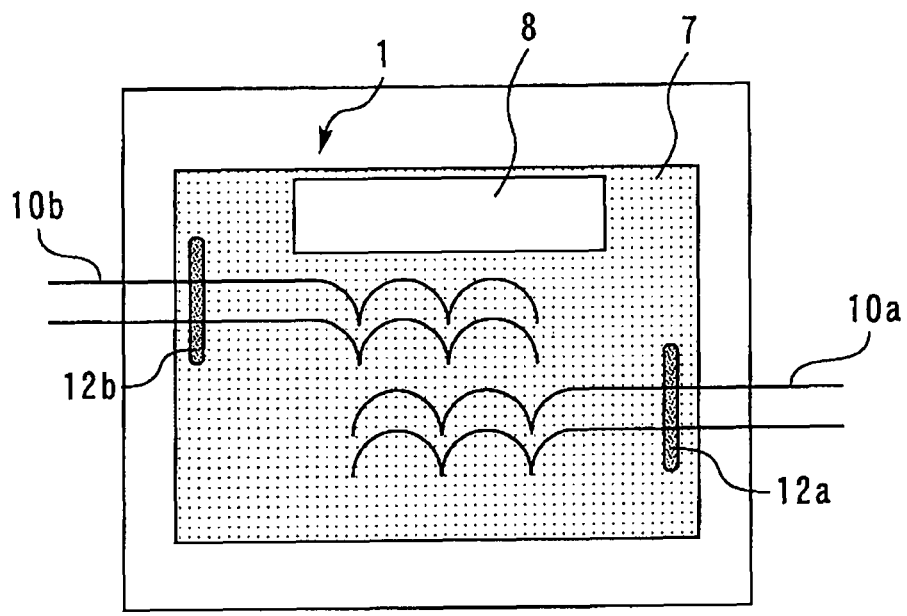
FIG. 5 is a plan view showing a modified embodiment of a semiconductor device according to the first embodiment of the present invention.

FIG. 5 is a plan view showing a modified embodiment of a semiconductor device according to the first embodiment of the present invention. Leading lines 10a and 10b are drawn to each of different directions. Below the leading lines 10a and 10b, magneto-resistance elements 12a and 12b are placed, respectively. Thereby, the shunt ratio of the currents shared by each of the leading lines 10a and 10b can be sensed. Therefore, the uniformity of the current density in the chip and the variation thereof can be controlled.

The semiconductor element 1 is not limited to the IGBT, but can be a vertical power device such as a power MOSFET (power metal-oxide-semiconductor field-effect transistor) or a diode.

Second Embodiment

Figure 6:
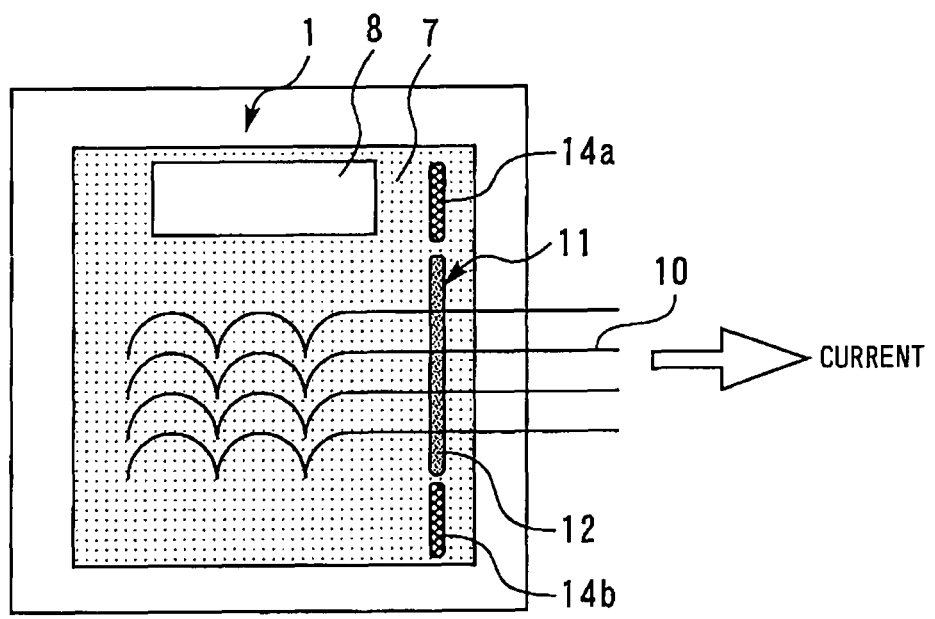
FIG. 6 is a plan view showing a semiconductor device according to the second embodiment of the present invention.

FIG. 6 is a plan view showing a semiconductor device according to the second embodiment of the present invention. The current sensor 11 further includes first and second ferromagnetic bodies 14a and 14b. The first and second ferromagnetic bodies 14a and 14b extend at right angle to the current direction, and are placed so as to pinch the magneto-resistance element 12. Thereby, since magnetic fields generated when applying a current can be converged, the sensitivity of the magneto-resistance element 12 can be improved.

Third Embodiment

Figure 7:
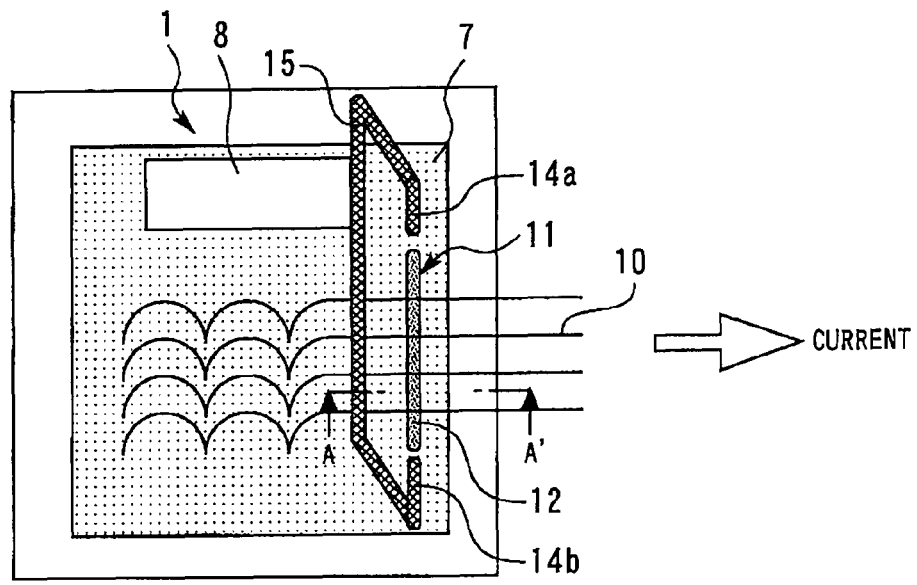
FIG. 7 is a plan view showing a semiconductor device according to the third embodiment of the present invention.
Figure 8:
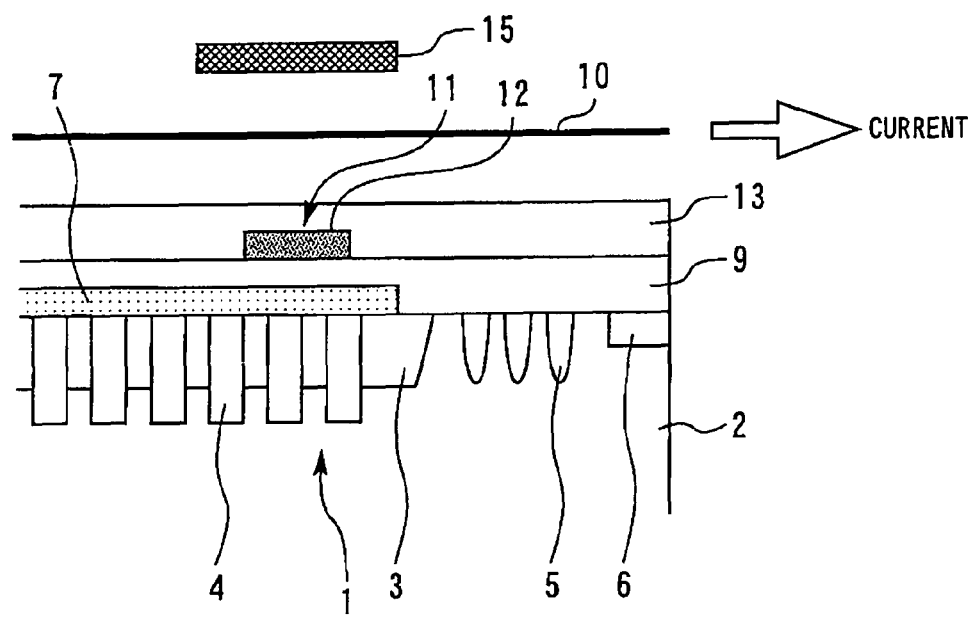
FIG. 8 is a sectional view taken along the line A-A' in FIG. 7.

FIG. 7 is a plan view showing a semiconductor device according to the third embodiment of the present invention. FIG. 8 is a sectional view taken along the line A-A' in FIG. 7. A bridge-shaped body 15 composed of a ferromagnetic material is connected to the first and second ferromagnetic bodies 14a and 14b. The bridge-shaped body 15 is insulated from the magneto-resistance element 12 and the leading line 10. Since magnetic fields can be further converged by the bridge-shaped body 15, the sensitivity of the magneto-resistance element 12 can further be improved.

Alternatively, the bridge-shaped body 15 can be formed by sputtering after forming the first and second ferromagnetic bodies 14a and 14b followed by forming and patterning the insulating isolation film, or the bridge-shaped body 15 previously formed as housing can be joined to the first and second ferromagnetic bodies 14a and 14b.

Fourth Embodiment

Figure 9:
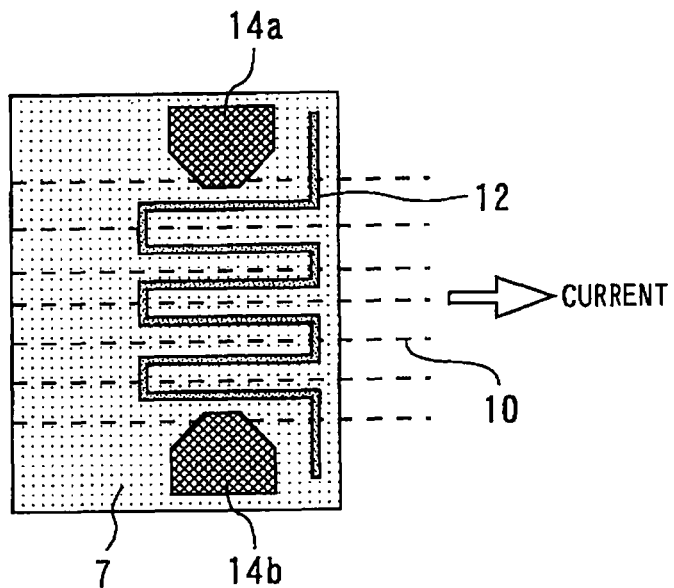
FIG. 9 is a plan view showing a semiconductor device according to the fourth embodiment of the present invention.

FIG. 9 is a plan view showing a semiconductor device according to the fourth embodiment of the present invention. The magneto-resistance element 12 has a winding (crank) shape winding several times vertically to the magnetic field. Thereby, since the magneto-resistance element 12 has a long line length for receiving converged magnetic field, the variation of magnetic field can be easily sensed.

Fifth Embodiment

Figure 10:
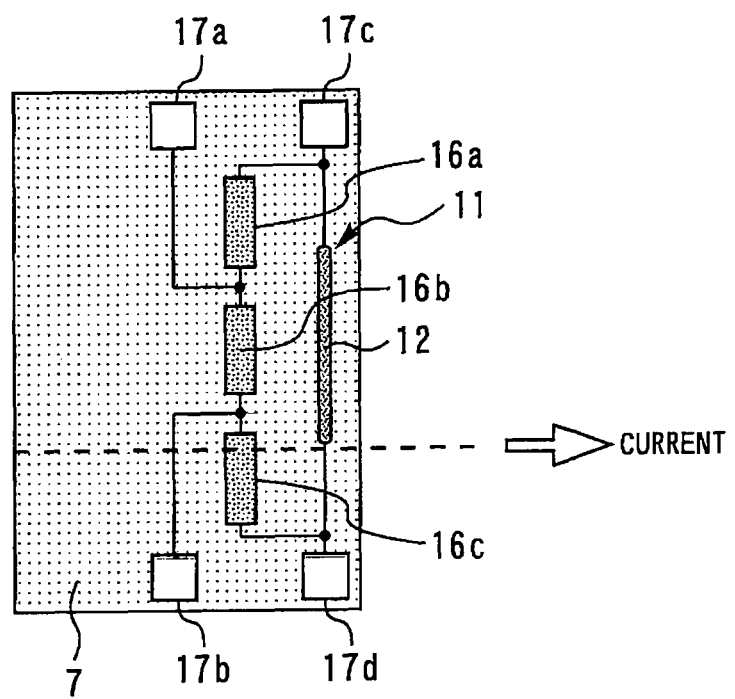
FIG. 10 is a plan view showing a part of a semiconductor device according to the fifth embodiment of the present invention.

FIG. 10 is a plan view showing a part of a semiconductor device according to the fifth embodiment of the present invention. Fixed resistors 16a to 16c whose resistance values are not varied by magnetism are placed on an emitter electrode 7. The fixed resistors 16a to 16c are connected to the magneto-resistance element 12 to constitute a bridge circuit. Electrode pads 17a to 17d are formed on respective connecting points in the bridge circuit, and can be connected to optional external circuits. Thereby, the variation of the resistance value of the magneto-resistance element 12 can be accurately sensed.

Figure 11:
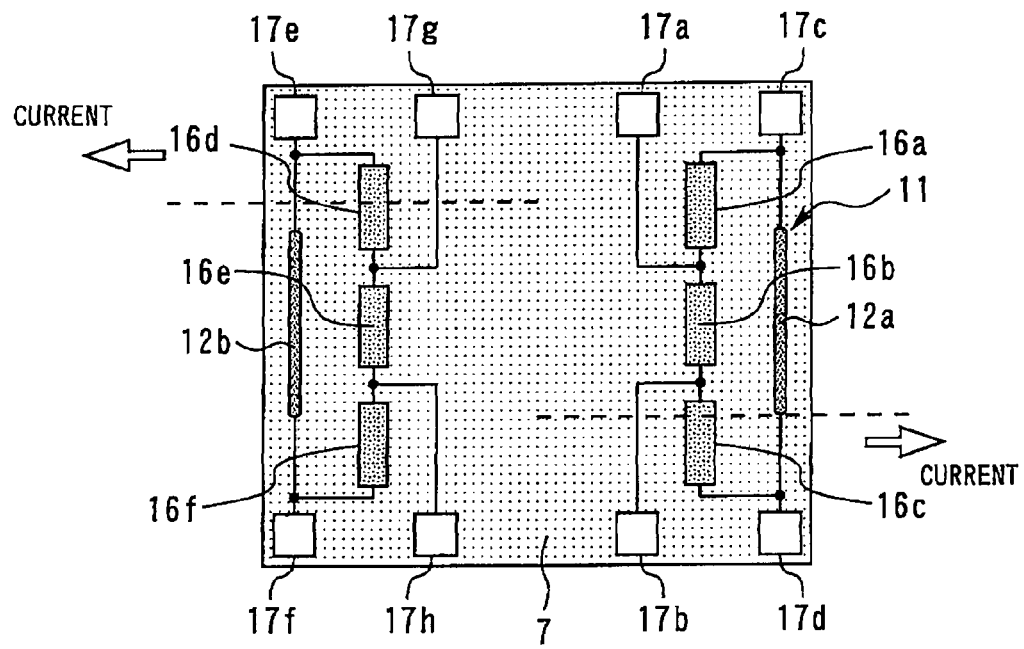
FIG. 11 is a plan view showing a part of a modified embodiment of a semiconductor device according to the fifth embodiment of the present invention.

FIG. 11 is a plan view showing a part of a modified embodiment of a semiconductor device according to the fifth embodiment of the present invention. Leading lines 10a and 10b are drawn to each of different directions. Below the leading lines 10a and 10b, magneto-resistance elements 12a and 12b are placed, respectively. Fixed resistors 16a to 16c and 16d to 16f are connected to the magneto-resistance elements 12a and 12b to constitute a bridge circuit. Electrode pads 17a to 17h are formed on each connecting point in the bridge circuit, and can be connected to optional external circuits.

Thereby, the shunt ratio of current shared by each of leading lines 10a and 10b can be sensed. Therefore, the uniformity of current density in a chip and the variation thereof can be controlled. In addition, change in the resistance value of the magneto-resistance element 12 can be detected with high accuracy.

Sixth Embodiment

Figure 12:
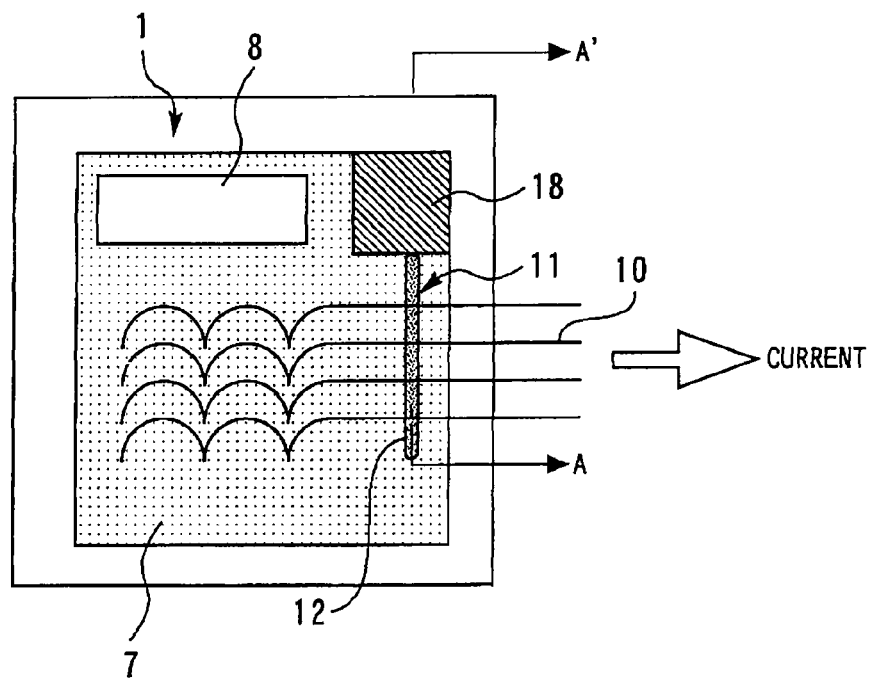
FIG. 12 is a plan view showing a semiconductor device according to the sixth embodiment of the present invention.
Figure 13:
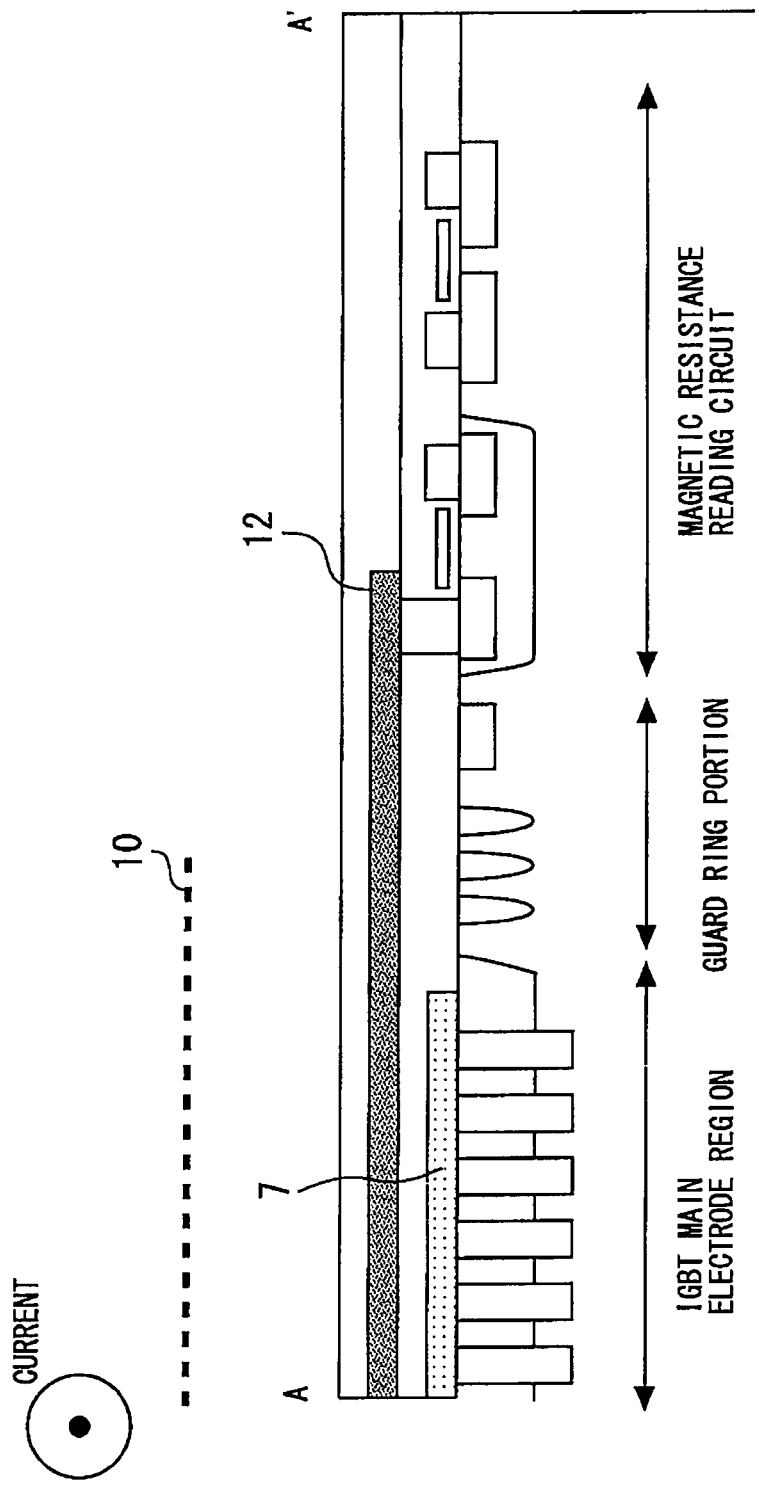
FIG. 13 is a sectional view taken along the line A-A' in FIG. 12.

FIG. 12 is a plan view showing a semiconductor device according to the sixth embodiment of the present invention. FIG. 13 is a sectional view taken along the line A-A' in FIG. 12. A magnetic resistance reading circuit 18 for reading the resistance value of the magneto-resistance element 12 is formed in the same chip as the semiconductor element 1 using the CMOSIC process. The magneto-resistance element 12 extends from the IGBT main electrode region through the guard ring portion to the magnetic resistance reading circuit 18, and is connected to the magnetic resistance reading circuit 18. By placing the magnetic resistance reading circuit 18 in the same chip as the semiconductor element 1, fast and highly accurate feedback control can be performed.

Obviously many modifications and variations of the present invention are possible in the light of the above teachings. It is therefore to be understood that within the scope of the appended claims the invention may be practiced otherwise than as specifically described.

The entire disclosure of a Japanese Patent Application No. 2010-286342, filed on Dec. 22, 2010 including specification, claims, drawings and summary, on which the Convention priority of the present application is based, are incorporated herein by reference in its entirety.

What is claimed is:

1. A semiconductor device comprising:
    a substrate;
    a semiconductor element including an electrode, the electrode disposed above the substrate in a first dimension;
    a plurality of leading lines, each of the plurality of leading lines electrically connected to the electrode, and disposed entirely above the electrode and the substrate in the first dimension and led to a side of the electrode in a second dimension; and
    a current sensor sensing current flowing through the plurality of leading lines, wherein
    the current sensor includes a magneto-resistance element disposed above the electrode and the substrate in the first dimension and below the plurality of leading lines in the first dimension, and
    a resistance value of the magneto-resistance element varies linearly according to magnetic field generated by the current, wherein
    the semiconductor element is a switching device.

2. The semiconductor device according to claim 1, wherein the magneto-resistance element is a spin-valve tunnel magneto resistance element.

3. The semiconductor device according to claim 1, wherein the magneto-resistance element is a spin-valve giant magneto resistance element.

4. The semiconductor device according to claim 1, wherein the magneto-resistance element is an anisotropic magneto resistance element with barber-pole electrodes.

\* \* \* \* \*